United States Patent [19]

Brust

[11] Patent Number: 4,678,988
[45] Date of Patent: Jul. 7, 1987

[54] METHOD AND APPARATUS FOR SPECTRAL ANALYSIS OF A SIGNAL AT A MEASURING POINT

[75] Inventor: Hans-Detlef Brust, Dudweiler, Fed. Rep. of Germany

[73] Assignee: Siemens Aktiengesellschaft, Berlin and Munich, Fed. Rep. of Germany

[21] Appl. No.: 717,104

[22] Filed: Mar. 28, 1985

[30] Foreign Application Priority Data

May 30, 1984 [DE] Fed. Rep. of Germany ....... 3420269

[51] Int. Cl.$^4$ ............................................ G01R 31/28
[52] U.S. Cl. ............................ 324/158 R; 324/73 PC; 324/79 R
[58] Field of Search ............ 324/158 R, 158 D, 71.3, 324/73 PC, 79 R, 73 R; 250/310, 311

[56] References Cited

U.S. PATENT DOCUMENTS 2,507,525  5/1950  Hurvitz ............................ 324/79 R
4,292,519  9/1981  Feuerbaum ..................... 324/158 R Primary Examiner—Ernest F. Karlsen
Attorney, Agent, or Firm—Hill, Van Santen, Steadman & Simpson

[57] ABSTRACT

With the method and apparatus for the deteetion and/or imaging of a measuring point which carries a voltage at least of a specific frequency, wherein, in a scanning particle or radiation microscope, a voltage contrast signal is further processed into a measuring signal by a lock-in amplifier, a spectral analysis of a voltage carried at the measuring point is possible even when one or more frequencies from the spectrum of this signal are unknown. A reference signal is supplied to the lock-in amplifier at a frequency fb which is varied over a frequency range. A signal regarding the magnitude of the frequency fb of the reference signal is transmitted to a device for the recording of the measuring signal so that the measuring signal can be indicated in dependence upon the frequency fb of the reference signal.

13 Claims, 1 Drawing Figure

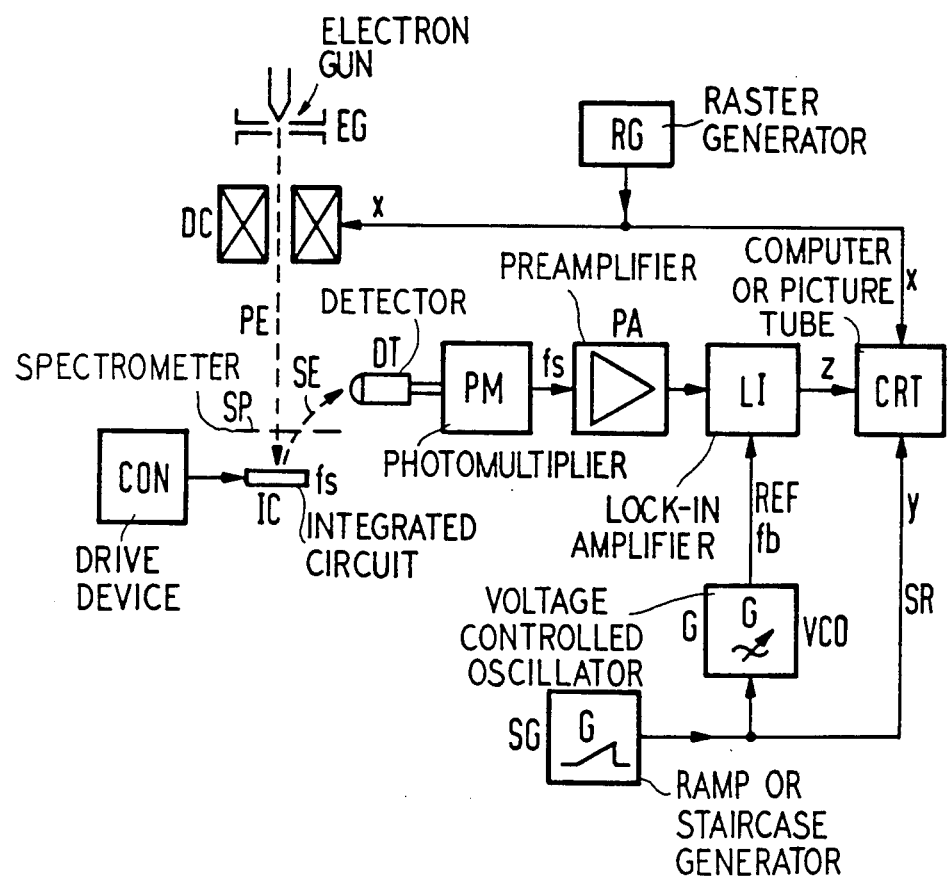

METHOD AND APPARATUS FOR SPECTRAL ANALYSIS OF A SIGNAL AT A MEASURING POINT

BACKGROUND OF THE INVENTION

1. Field of the Invention

The present invention relates to a method and to an apparatus for the detection and/or qualitative and/or quantitative imaging of measuring points which carry a voltage of at least a specific frequency with the aid of an electron microscope in which the measuring point is subjected to primary electrons, in which secondary electrons are released by the primary electrons at the measuring point and are detected in a detector and in which a secondary electron signal resulting therefrom is further processed by way of a lock-in amplifier into a measuring signal.

2. Description of the Prior Art

In the case of faulty behavior of integrated circuits, there is a desire, for the purpose of locating a defect, to compare the behavior of the integrated circuit with the nominal behavior, such as results from simulation. To this end, it must be checked inter alia which frequency or which frequency spectrum a signal exhibits at a measuring point within the integrated circuit.

From the prior art up to the present, three methods are known with which it is possible to check whether specific internal periodic signals of a specific frequency are present at a measuring point within an integrated circuit. From the publication "Scanning Electron Microscopy", 1975, Part I, Proc. of the Eighth Annular Scanning Electron Microscope Symposium, Chicago, IIT Research Institute, pp. 465–471, the method of the so-called "voltage coding" is known. The voltage coding method images the dynamic voltage distribution of the integrated circuit on a television monitor. The voltage coding method makes possible a chronological allocation of the switching states in the various components, and is therefore particularly suited for the rapid operational check of integrated circuits. However, the voltage coding method has grave disadvantages which inevitably results from the line frequency of the electron beam.

From the U.S. Pat. No. 4,223,220, fully incorporated herein by this reference, a so-called "logic state mapping" method is known. In the logic state mapping method, the dynamic voltage distribution is imaged with the aid of a stroboscope effect. The logic state mapping method compared with the voltage coding method, given the same voltage resolution, delivers a time resolution greater by orders of magnitude. The logic state mapping method, moreover, simplifies the recording, since the images of the dynamic voltage distribution can be directly photographed from the photo display screen of a scanning electron microscope. In the case of the voltage coding method, by contrast, a recording of the dynamic voltage distribution is possible only with a tape memory or with photos from a television monitor.

According to a third method disclosed by J. P. Collin in the publication Proceedings of Journee d'Electronique, 1983, "Testing Complex Integrated Circuits: A Challenge", published by the Swiss Federal Institute of Technology, Lausanne, Switzerland, pp. 283–298, entitled "Un Alternative Economique au Contraste de Potentiel Stroboscopique: LeTraitement du Signal d'Electrons Secondaires d'un Microscope a Balayage", the location of specific frequencies at a measuring point within an integrated circuit is carried out pursuant to utilization of a lock-in amplifier. From a voltage contrast signal obtained at a measuring point within the integrated circuit, with the aid of a lock-in amplifier, a signal with the sought frequency is filtered out and then the intensity of the signal is imaged as a variation in brightness.

The three methods set forth above, such as are known from the prior art, can be carried out only with difficulty in part and, in part, permit only a check of some few interconnections in the integrated circuit. Moreover, the methods known from the prior art assume that one knows the frequency of a signal to be sought, or that a signal synchronous with the signal to be sought is accessible from the exterior. If the frequency of a sought-for signal is unknown, the search for such a signal becomes very laborious and expensive. This is the case, for example, when the frequency of the signal to be sought is obtained through a division by 255 instead of through a division by 256.

SUMMARY OF THE INVENTION

The object of the present invention, therefore, is to provide a method and an apparatus of the type set forth above, with the aid of which a spectral analysis of a voltage carried out at a measuring point is also possible when one or more frequencies from the spectrum of this signal are unknown.

According to the invention, the above object is achieved through a method in which a particle or radiation microscope bombards a measuring point with primary particles or radiation which cause the emission of secondary particles or radiation which are, in turn, detected in a detector and in which the secondary particle or radiation signal resulting from detection is further processed by way of a lock-in amplifier into a measuring signal. This method is particularly characterized in that a signal is supplied in the form of a reference signal to the lock-in amplifier, the frequency of a signal being altered over a frequency range, and a signal representing the magnitude of the frequency of the reference signal is transmitted to a device for recording the measuring signal so that the measuring signal can be indicated in dependence upon the frequency of the reference signal.

According to the invention, a photo multiplier and an amplifier are provided between the detector and the lock-in amplifier and a drive is provided for driving the integrated circuit with a signal of the predetermined frequency. A device is provided for producing the variable frequency reference signal for the lock-in amplifier and for simultaneously driving the recording device. By sweeping the reference frequency of the lock-in amplifier, frequency spectrum under consideration can be traversed and, in this manner, in the case of an unknown frequency, the frequencies occurring at a measuring point, for example, on a interconnection in an integrated circuit, can be determined. The method and apparatus of the present invention make possible a representation of the signal frequencies occurring within an integrated circuit, in case one or more frequencies of a sought-for signal are unknown.

BRIEF DESCRIPTION OF THE DRAWING

Other objects, features and advantages of the invention will become apparent from the following detailed description taken in conjunction with the accompanying drawing, on which there is a single schematic representation of apparatus for carrying out the invention.

DESCRIPTION OF THE PREFERRED EMBODIMENTS

Referring to the drawing, although the following exemplary embodiment relates to an electron microscope, the invention is to be so understood that, instead of electrons, also ions or other particles or radiation can be employed; namely, both as primary particles or radiation and as secondary particles or radiation.

The drawing illustrates an apparatus for the detection and/or qualitative and/or quantitative imaging of a measuring point of an interconnection and the determination of one or more frequencies which are contained in the frequency spectrum of a signal at the measuring point of the interconnection. Issuing from an electron source EG are primary electrons PE which strike a measuring point (interconnection) within an integrated circuit IC and cause the emission of secondary electrons SE. The secondary electrons SE are detected in a detector DT. In dependence upon secondary electron current which strikes the detector DT, in the detector DT a secondary electron signal is produced which is fed to a photo multiplier PM and is amplified therein. The amplified secondary electron signal fs is then fed to a preamplifier PA for further amplification and transmission to a lock-in amplifier LI. An Ithaco amplifier type 491A, for example, can be employed as the lock-in amplifier LI. The output signal of the lock-in amplifier LI, for example, can control the intensity of an electron beam in a picture tube CRT.

The integrated circuit IC is driven with a signal of the frequency n·fs from a drive device CON. If the beam of the primary electrons PE strikes a measuring point within the integrated circuit or within another specimen, and if the measuring point carries a signal with the initially unknown frequency fs, the current of the secondary electrons SE, which, in the final analysis, is supplied in the form of a secondary electron signal to the lock-in amplifier, also contains a signal component with the initially unknown frequency fs. From the secondary electron signal, accordingly, in the lock-in amplifier LI, the signal component with the initially unknown frequency fs can be filtered out when a signal is supplied in the form of a reference signal REF to the lock-in amplifier LI, the frequency fb of the reference signal corresponding to the initially unknown frequency fs in the frequency spectrum of the secondary electron signal. The amplitude Z of the signal with the initially known frequency fs, which was a component portion of the secondary electron signal, if the frequency fb of the reference signal REF corresponds to the frequency fs, can then, as the output of the lock-in amplifier LI, control the intensity of the electron beam in the picture tube CRT of a scanning electron microscope. Simultaneously, with a signal SR, which corresponds to the value of the frequency fb of the reference signal REF, likewise the picture tube CRT or another recording device such as, for example, a computer or a plotter, can be activated.

By way of a raster generator RG, the deflection device of a scanning electron microscope can be activated. The information regarding on which measuring point of a surface the beam of the primary electron PE has been just deflected thereby, can likewise be supplied to the picture tube CRT or any other random recording device, such as, for example a computer or a plotter. In this manner, it can be indicated, as the end result of a measurement, which measuring point at what location within a sample carries the frequency fb. If, in the detection of the secondary electrons SE, a spectrometer SP is employed, such as known, for example, from U.S. Pat. No. 4,292,519, fully incorporated herein by this reference, then quantitative measurements can be conducted. In utilizing such a spectrometer SP, in addition, in absolute numbers, amplitudes of specific frequencies can be compared in frequency spectra which are determined at different measuring points. The present invention therefore makes possible an actual spectral analysis, whereby fundamental oscillations and harmonic oscillations of signals can be distinguished due to the intensity of the individual Fourier components. In order to represent the individual Fourier components of a signal on a measuring point, advantageously the frequency pb on a picture tube CRT is plotted in the x direction and the signal level of the Fourier components is plotted in the y direction of the picture tube CRT. If the reference signal REF exhibits a current frequency fb, then the respective output signal of the lock-in amplifier corresponds to the signal level of the Fourier component, pertaining to the frequency fb, in the spectrum of the signal on the justchecked measuring point. If, instead of a single measuring point, several measuring points (interconnections) are to be checked successively or continuously as to the frequency spectrum of the signals carried thereon, a computer is preferred to a picture tube CRT as the recording medium.

In utilizing a computer as the recording medium, measuring points in a two-dimensional area can also be scanned with the beam of the primary electrons PE, as long as information regarding the respective current frequency fb and information regarding the position of the beam of the primary electrons PE is input into the computer or in another recording medium.

If the beam of the primary electrons PE scans measuring points on a sample only along one line (for example in the x direction), it is possible to superimpose the variation of the frequency fb on the one-dimensional variation of the impingement location of the beam of the primary electrons PE on the specimen. For this purpose, a generator SG generates a ramp signal or a staircase signal SR. This ramp or staircase signal SR is supplied to an input of the picture tube CRT and simultaneously activates a voltage-dependent oscillator (VCO=voltage controlled oscillator) G. The generator G delivers the reference signal REF with a frequency fb which corresponds to the magnitude of the ramp signal SR. The beam of the primary electrons PE constantly scans, in a continuous or intermittent fashion, along a line (line scan) in the x direction while, at the same time, the frequency fb of the reference signal REF sweeps over the frequency range under consideration. A voltage SR, proportional to the current frequency fb, simultaneously deflects the electron beam in the picture tube CRT in the y direction.

Always in those instances in which the frequency fb attains the value of a frequency fs, which is present in the frequency spectrum of a signal at a measuring point, a line appears on the display screen of the picture tube CRT, and one therefore obtains a representation of the frequencies fs carried at the scanned measuring points. If a comparator circuit is connected to the output of the lock-in amplifier LI, the lines on the display screen CRT appear bright. Otherwise, the grey value of the respective line is determined by the magnitude of the respective Fourier component.

The beam of the primary electrons PE can scan a group of measuring points in repeated succession so rapidly, respectively, that the value of the frequency fb in the case of a one-time scanning of this group of measuring points, does not vary by more than the bandwidth of the lock-in amplifier. The maximally-allowable frequency deviation is determined by the bandwidth of the lock-in amplifier LI.

Finally, it is additionally possible to reverse the speed ratios of beam deflection of the primary electrons PE and sweeping over a frequency range regarding the frequency fb. The beam deflection of the primary electrons PE can, again, proceed either continuously or through jumping between several measuring points (interconnections). To this end, for example, the beam of the primary electrons PE is first positioned on the first measuring point (interconnection) and then, with respect to the frequency fb, the frequency range of interest is traversed. Subsequently, the beam of the primary electrons PE jumps to the next measuring point (interconnection), where the frequency fb is again swept.

As basic equipment for an apparatus constructed in accordance with the present invention and for carrying out the method of the invention, a scanning electron microscope can be employed such as is known from the U.S. Pat. Nos. 4,220,853, 4,220,854 and 4,227,679, fully incorporated herein by this reference, for a quantitative voltage measurement, and from U.S. Pat. No. 4,223,220 mentioned above for a qualitative voltage measurement.

Basically, any tunable filter whose center frequency can be altered by way of a control signal and a demodulator can take the place of the lock-in amplifier LI. Entering into consideration for this purpose, are, for example, "switched capacitor" filters or a mixer having a band pass filter connected to the output thereof.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A method for detecting and imaging a measuring point of a specimen which carries a voltage of at least one frequency, with the assistance of a microscope, comprising the steps of:
   radiating the measuring point with a primary beam to cause emission of secondary radiation representing the voltage at the measuring point;
   detecting and converting the secondary radiation into a signal representing the voltage at the measuring point;
   applying a reference signal to a variable-frequency filter to define the center frequency of the filter;
   filtering the detected and converted signal with the variable-frequency filter to produce a measuring signal dependent on the center frequency of the filter;
   applying a reference signal to a recording device to define the center frequency; and
   applying the measuring signal to and recording the measuring signal with the recording device.

2. The method of claim 1, and further comprising the steps of:
   deflecting the primary beam; and
   transmitting information to the recording device concerning the deflection so that the measuring point is also indicated in dependence on the location of the measuring point.

3. The method of claim 1, wherein the step of radiating is further defined as:
   directing the primary beam onto a single measuring point;
   varying the frequency of the reference signal and the resulting center frequency within a predetermined range; and
   repeating the direction of the beam and the variation of the reference signal at a plurality of measuring points.

4. The method of claim 1, wherein the step of radiating is further defined as:
   deflecting the primary beam to scan a plurality of measuring points; and
   varying the center frequency of the filter at a rate of change which is low in comparison to the deflection speed of the primary beam.

5. Apparatus for detecting and imaging a measuring point of a circuit carrying a voltage of at least one frequency, comprising:
   means for driving the circuit at said at least one frequency;
   radiation generating means for bombarding the measuring point with a primary beam to cause the emission of secondary radiation representing the voltage;
   detecting means for detecting and converting the secondary radiation into a first signal;
   a recording device;
   signal generating means including first and second outputs, for generating a variable frequency reference signal at said first output and an activation signal at said second output, said second output connected to said recording device; and
   a variable-frequency filter connected to said detecting means for receiving said first signal and connected to said first output of said signal generating means for receiving said variable frequency reference signal which defines the center frequency of said filter, and connected to said recording device, said variable-frequency filter operable to produce a signal to be recorded.

6. The apparatus of claim 5, wherein:
   said variable-frequency filter comprises a lock-in amplifier.

7. The apparatus of claim 5, wherein:
   said signal generating means comprises a ramp generator connected to said recording device and a voltage control oscillator connected to said ramp generator and operable to produce said reference signal in response to the generated ramp signal.

8. The apparatus of claim 5, and further comprising:
   a raster generator connected to said radiation generating means and to said recording means for deflecting the primary beam and driving the recording device with the same information.

9. The apparatus of claim 5, wherein said detecting means comprises:
   a spectrometer in the path of the secondary radiation for quantative measurement of the secondary radiation.

10. The apparatus of claim 5, and further comprising:
a comparator connected between said variable-frequency filter and said recording device.

11. The apparatus of claim 5, and further comprising:
a retarding field spectrometer including a field electrode carrying a constant voltage in the secondary emission path.

12. The apparatus of claim 5, wherein:
said radiation generating means comprises an electron gun.

13. The apparatus of claim 5, wherein:
said recording device comprises cathode ray tube means and the output of said variable-frequency filter controls the beam brightness of said cathode ray tube means.

* * * * *